(12) United States Patent
Lee

(10) Patent No.: US 7,786,519 B2
(45) Date of Patent: Aug. 31, 2010

(54) LIGHT EMITTING DEVICE AND METHOD FOR MANUFACTURING THE SAME

(75) Inventor: Chun Tak Lee, Gumi-si (KR)

(73) Assignee: LG Electronics Inc., Seoul (KR)

(*) Notice: Subject to any disclaimer, the term of this patent is extended or adjusted under 35 U.S.C. 154(b) by 335 days.

(21) Appl. No.: 11/645,541

(22) Filed: Dec. 27, 2006

(65) Prior Publication Data

US 2007/0235767 A1    Oct. 11, 2007

(30) Foreign Application Priority Data

Apr. 10, 2006 (KR) .................. 10-2006-0032511

(51) Int. Cl.
*H01L 31/062* (2006.01)
(52) U.S. Cl. .................. 257/290; 257/40; 257/79; 257/81; 257/758; 257/E33.076
(58) Field of Classification Search ............ 257/40, 257/79, 83, 758, 773, 776
See application file for complete search history.

(56) References Cited

U.S. PATENT DOCUMENTS

| | | | |
|---|---|---|---|
| 6,190,957 B1 * | 2/2001 | Mochizuki et al. | 438/240 |
| 6,197,682 B1 * | 3/2001 | Drynan et al. | 438/639 |
| 6,297,589 B1 | 10/2001 | Miyaguchi et al. | |
| 2002/0195713 A1 * | 12/2002 | Yang et al. | 257/758 |
| 2003/0096441 A1 * | 5/2003 | Kim | 438/57 |
| 2004/0245641 A1 * | 12/2004 | Eguchi | 257/758 |
| 2005/0206825 A1 * | 9/2005 | Kaneko et al. | 349/141 |
| 2006/0001365 A1 | 1/2006 | Chae et al. | 313/506 |

FOREIGN PATENT DOCUMENTS

| | | |
|---|---|---|
| CN | 1496200 | 5/2003 |
| CN | 1628389 | 6/2005 |
| EP | 1 648 033 A2 | 4/2006 |
| EP | 1 715 533 A2 | 10/2006 |
| WO | 02/089177 A2 | 11/2002 |

OTHER PUBLICATIONS

Chinese Office Action received on Sep. 12, 2008.
European Search Report dated Aug. 16, 2007.

* cited by examiner

*Primary Examiner*—Jerome Jackson, Jr.
*Assistant Examiner*—Dale Page
(74) *Attorney, Agent, or Firm*—Ked & Associates LLP

(57) ABSTRACT

This document discloses an organic light emitting device comprising a first electrode and a wire comprising a contact part formed on a substrate, an insulating layer formed on the first electrode and a portion of the wire, the insulating layer comprising an opening which exposes a portion of the first electrode and a contact hole which exposes an entire upper surface of the contact part, an emission layer formed in the opening, a second electrode formed on the emission layer and the upper surface of the contact part though the contact hole.

7 Claims, 8 Drawing Sheets

LIGHT EMITTING DEVICE AND METHOD FOR MANUFACTURING THE SAME

CROSS-REFERENCE

This application claims priority to and the benefit of Korea Patent Application No. 10-2006-0032511, filed on Apr. 10, 2006, the entire content of which is incorporated herein by reference.

BACKGROUND

1. Field

The present invention relates to a light emitting device and a method for manufacturing the same.

2. Related Art

Among flat panel display devices, light emitting device has an advantage in that it has high response speed and low power consumption. The light emitting device can also be manufactured thin in size and light in weight because of not requiring backlight unit.

In particularly, organic light emitting device has an organic light emitting layer between an anode and a cathode. Holes from the anode and electrons from the cathode are combined within the organic light emitting layer to create hole-electron pairs, i.e., excitons. The organic light emitting device emits lights by energy generated while the excitons return to ground state.

FIG. 1A is a plan view of a prior art light emitting device, and FIG. 1B is a cross sectional view taken along line A-A' of FIG. 1A.

Referring to FIGS. 1A and 1B, the conventional light emitting device 100 comprises a substrate 110, and anodes 120 and wires 125 formed on the substrate 110, each wire 125 comprising a contact part 126 at an end of the wire 125. Wires 125 may comprise a conductive layer 125A and a metal layer 125B disposed on the conductive layer 125A. An insulating layer 130 is formed on the substrate 110 comprising the anodes 120 and wires 125 having contact parts 126. The insulating layer 130 comprises openings 135, each of which exposes a portion of each anode 120, and contact holes 136, each of which exposes a portion of each contact part 126.

Emission layers 150 are disposed within the openings 135 of the insulating layer 130, and barrier ribs 140 are formed on the insulating layer 130 in the shape of reverse taper. Cathodes 160 are disposed on the substrate 110 comprising the barrier ribs 140. The cathodes 160 are patterned by the barrier ribs 140 and connected electrically to the contact parts 126 exposed by the contact holes 136 and the emission layers 150 formed within the openings 135.

As can be seen from a contacting region indicated by alphabet 'E' of FIG. 1B, the contact hole 136 is formed to expose a portion of an upper surface of the contact part 126. Therefore, the contacting area of the contact part 126 and cathode 160 becomes narrow.

As a consequence, a peeling phenomenon of the insulating layer 130 can occur at the regions contact part 126 other than the regions exposed by the contact holes 136. And interfacial resistance between the contact part 126 and cathode 160 can be increased because the contacting area between the contact part 126 and cathode 160 are very narrow.

SUMMARY

Accordingly, the present invention provides an organic light emitting device comprising a first electrode and a wire comprising a contact part formed on a substrate, an insulating layer formed on the first electrode and a portion of the wire, the insulating layer comprising an opening which exposes a portion of the first electrode and a contact hole which exposes an entire upper surface of the contact part, an emission layer formed in the opening, a second electrode formed on the emission layer and the upper surface of the contact part though the contact hole.

Also, the present invention provides a method of fabricating a light emitting device comprising, forming a first electrode and a wire comprising a contact part on a substrate, forming an insulating layer on the first electrode and a portion of the wire, the insulating layer comprising an opening which exposes a portion of the first electrode and a contact hole which exposes an entire upper surface of the contact part, forming an emission layer in the opening, forming a second electrode on the emission layer and the upper surface of the contact part though the contact hole.

DETAILED DESCRIPTION

Figure 1A:
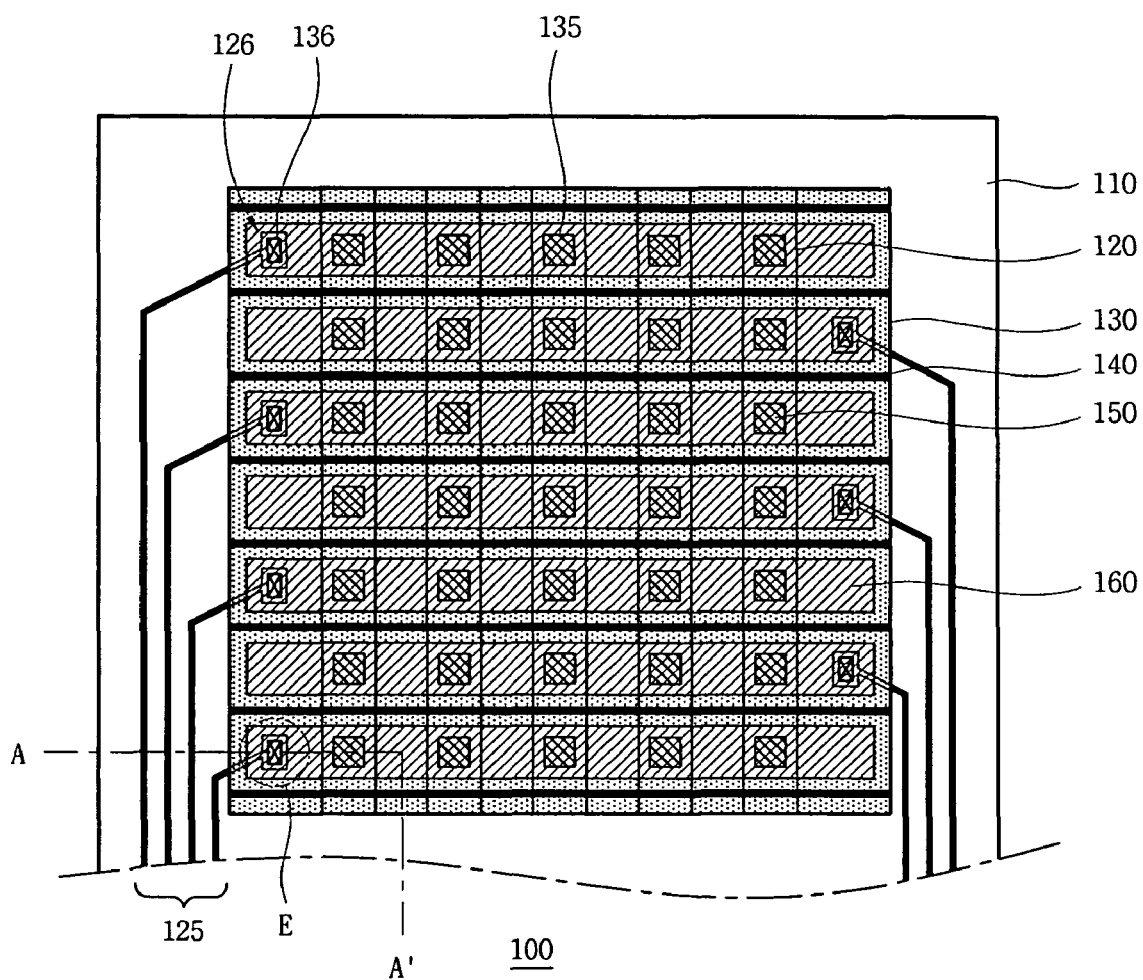
FIG. 1A is a plan view of illustrating a prior art light emitting device.
Figure 1B:
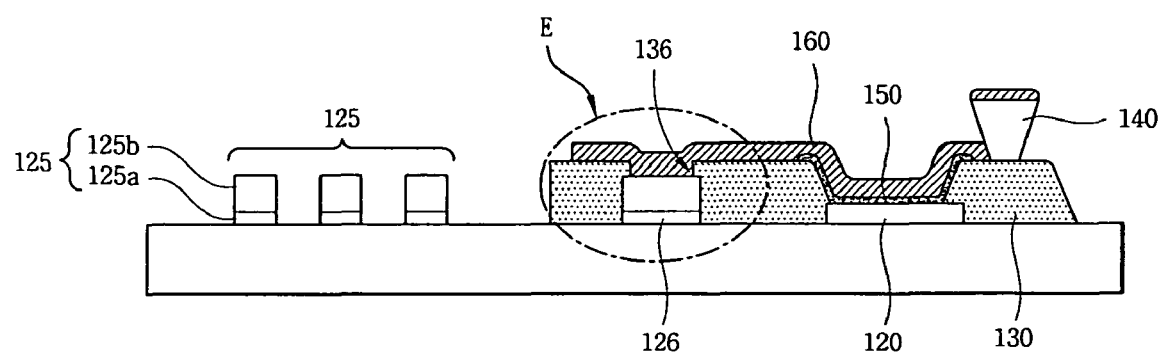
FIG. 1B is a cross sectional view taken along line A-A' of FIG. 1A.

An embodiment will be described with reference to the accompanying drawings. However, the present invention is not limited to one embodiment described below, but may be embodied in a variety of forms. In the drawings, if it is mentioned that a layer is positioned on a different layer or a substrate, the layer may be formed directly on the different layer or the substrate, or another layer may be interposed therebetween. Like reference numerals designate like elements.

An Embodiment

Figure 2A:
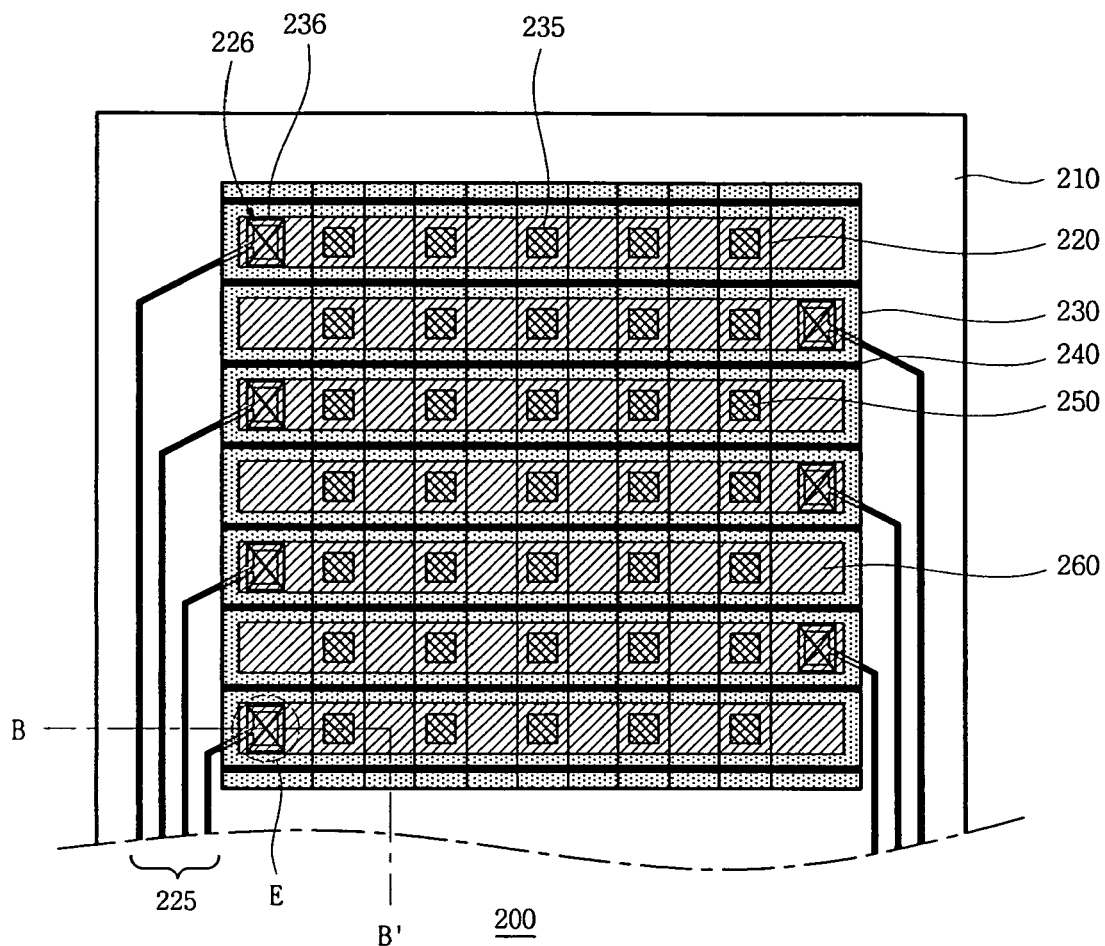
FIG. 2A is a plan view of a light emitting device according to an embodiment of the present invention.
Figure 2B:
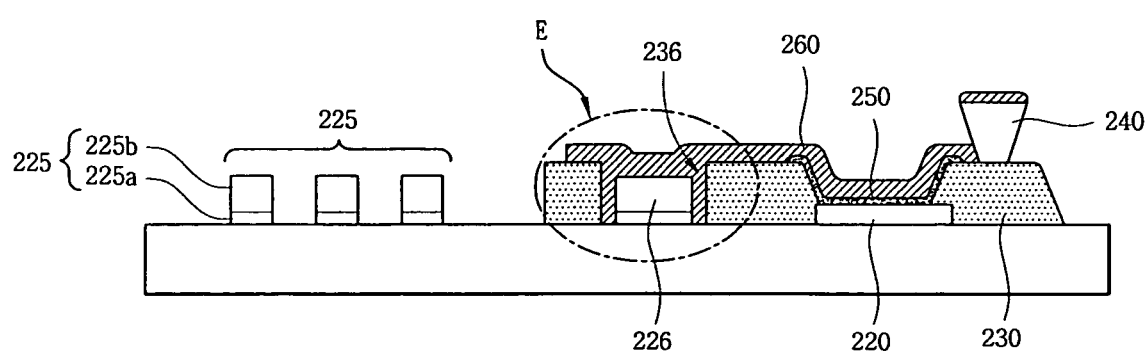
FIG. 2B is a cross sectional view taken along line B-B' of FIG. 2A.

FIG. 2A is a plan view of a light emitting device according to an embodiment of the present invention. FIG. 2B is across sectional view taken along line B-B' of FIG. 2A.

Referring to FIGS. 2A and 2B, the light emitting device 200 according to an embodiment of the present invention comprises a substrate 210, first electrodes 220 and wires 225 each having a contact part 226 at an end of the wire 225, wherein the first electrodes 220 and the wires 225 are disposed on the substrate 210. The first electrodes 220 may be anodes and comprise conductive films having high work functions. And, each wire 225 and contact part 226 comprise at least one conductive layer 225A and can be formed as a multiple-structure which comprises multiple metal layers 225B disposed on the conductive layer.

The conductive layer 225A may comprise Indium Tin Oxide(ITO), Indium Zinc Oxide (IZO) or Indium Tin Zinc Oxide (ITZO), and the metal layer 225B may comprise Molibden (Mo) or Aluminum(Al). Furthermore, the metal layer 225B may be formed as a triple-layer structure which consists of a first Mo layer, an Al layer, and a second Molibden layer.

The wires 225 are connected to cathodes 260 to be subsequently formed to supply electrical signals. While the wires 225 are arranged alternately in the left and right directions to reduce dead spaces, the wiring patterns are not limited thereto.

An insulating layer 230 is disposed on the first electrodes 220 and a portion of wires 225. The insulating layer 230 comprises openings 235 for exposing a portion of the first electrodes 220, and emission layers 250 are disposed within the openings 235.

The insulating layer 230 further comprises contact holes 236 for exposing entire upper surfaces of the contact parts 226. Here, the contact holes 236 can also be formed to expose both upper surfaces and side surfaces of the contact parts 226.

Barrier ribs 240 are formed on the insulating layer 230 in the shape of reverse taper, and second electrodes 260 are disposed on the substrate 220 comprising the barrier ribs 240. The second electrodes 260 may be cathodes which have low work functions and can provide the emission layers 250 with electrons. And, the second electrodes 260 are patterned by the barrier ribs and formed on the emission layers 250 and contact holes 226 exposed by the contact holes 236.

As can be seen through a contacting region marked by an alphabet 'E' of FIG. 2B, the second electrode 260 can contact with upper and side surfaces of the contact part 226 through the contact hole 236. Accordingly, as the contacting area between the second electrode 260 and contact part 226 increases, the interfacial resistance therebetween can be greatly lessened. Moreover, because the insulating layer 230 formed on the contact parts 226 are completely eliminated, the problem such as a peeling phenomenon of the insulating layer 230 which has occurred conventionally can be solved.

Hereinafter, a method for manufacturing a light emitting device according to an embodiment of the present invention will be described with reference to FIGS. 3A to 3H. Here, FIGS. 3B, 3D, 3F, and 3H each are cross sectional views taken along line C-C' of each of FIGS. 3A, 3C, 3E, and 3G.

Figure 3A:
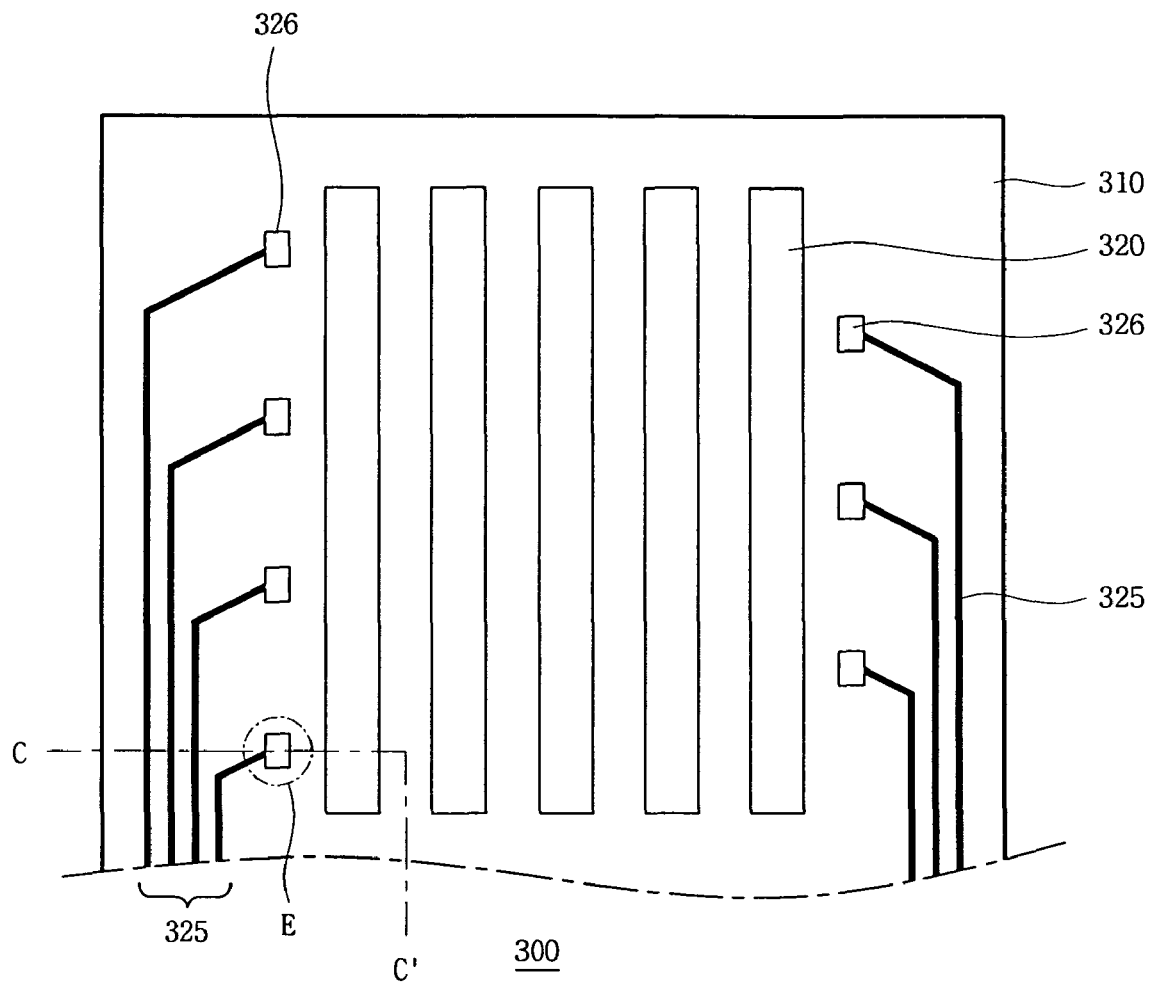
FIGS. 3A to 3H are plan views and cross sectional views for illustrating each process of a method for manufacturing a light emitting device according to an embodiment of the present invention.
Figure 3B:
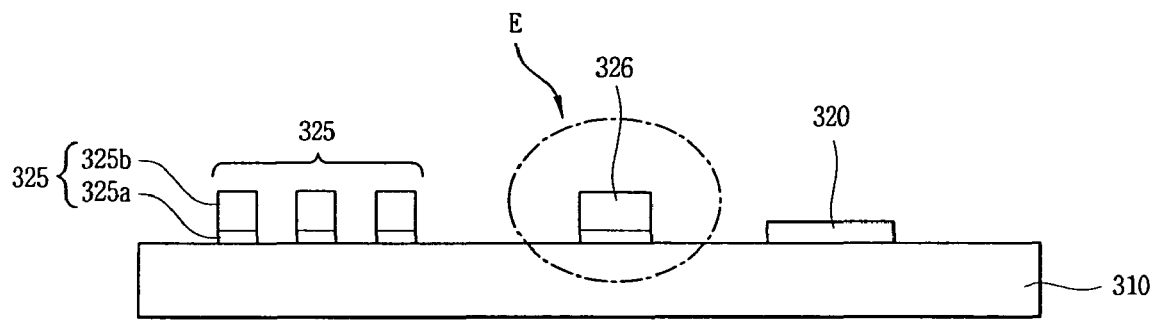

Referring now to FIGS. 3A and 3B, conductive layer is formed on a substrate 310 and then first electrodes 320 and wires 325 are formed by patterning the conductive layer. The first electrodes 320 are patterned in the shape of stripe and the wires 325 are spaced from the first electrodes 320 and each wire 325 has contact 326 at an end of the wire 325. The conductive layer may comprise Indium Tin Oxide (ITO), Indium Zinc Oxide (IZO) or Indium Tin Zinc Oxide (ITZO). The wires 325 comprising the contact parts 326 can be formed as a multiple-layer by depositing a metal layer 325B comprising Molibden or Al on the conductive layer 325A and then patterning it in order to reduce their resistance. For example, the contact parts 326 and wires 325 can be formed as a quadruple-layer structure which consists of ITO/MO/Al/MO.

Figure 3C:
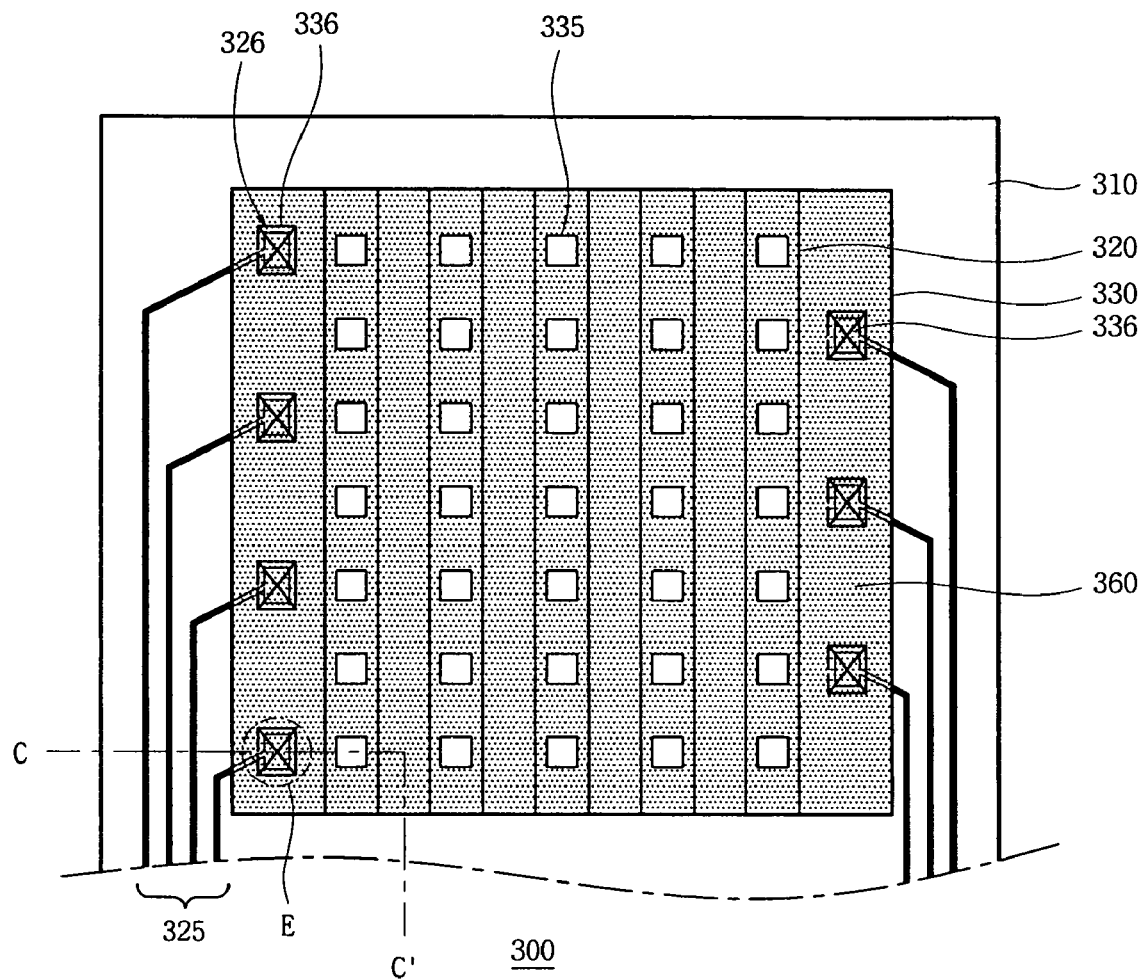
Figure 3D:
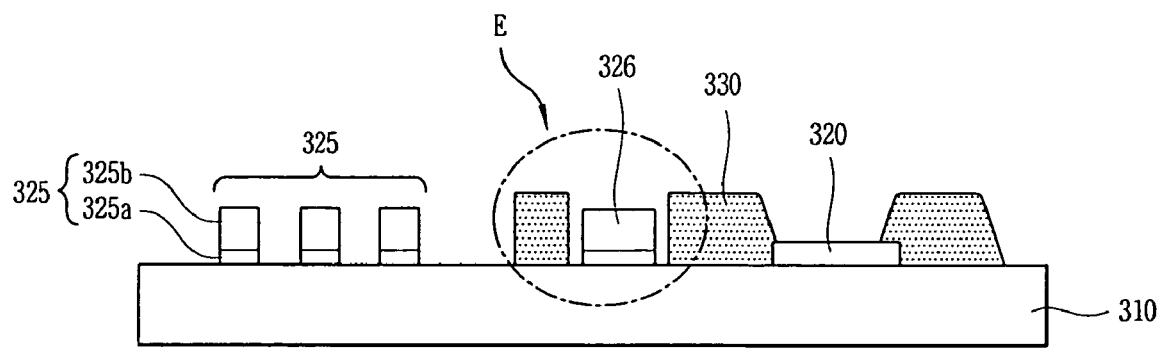

Referring to FIGS. 3C and 3D, next, an insulating layer 330 is formed on the substrate comprising the first electrodes 320 and wires 325 having the contact parts 326. The insulating layer 330 can be formed of silicon oxide (SiO2) or silicon nitride (SiNx). Subsequently, a portion of the insulating layer 330 is etched to form openings 335 for exposing a portion of the first electrodes 320 and contact holes 336 for exposing the contact parts 326. Here, the contact holes 336 can also be formed to expose both upper surfaces and side surfaces of the contact parts 326.

Figure 3E:
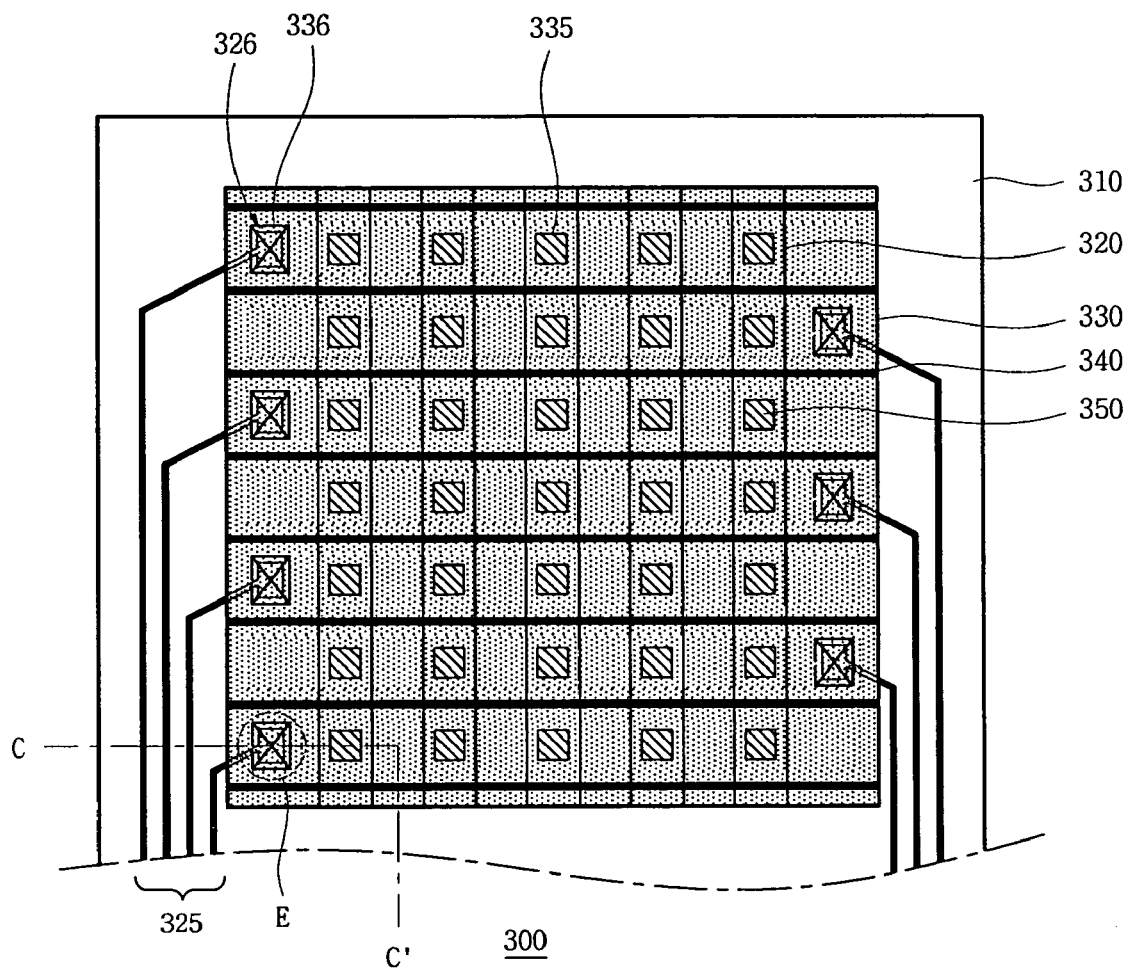
Figure 3F:
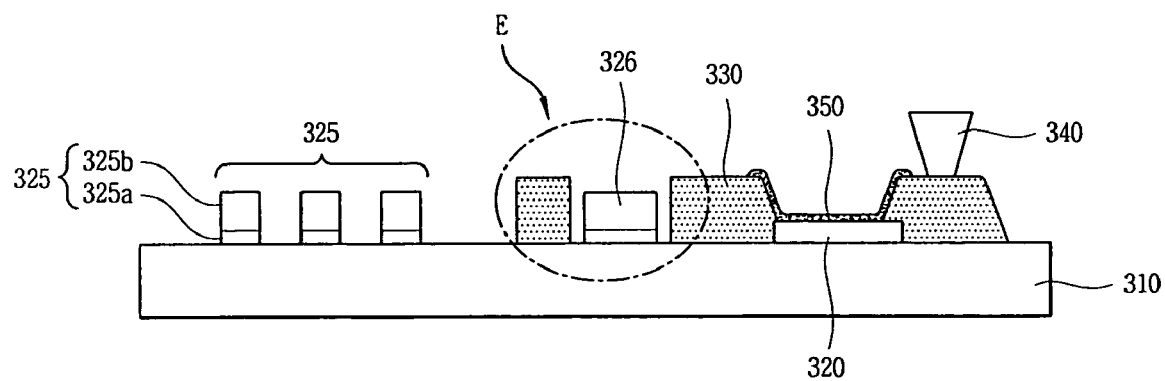
Figure 3G:
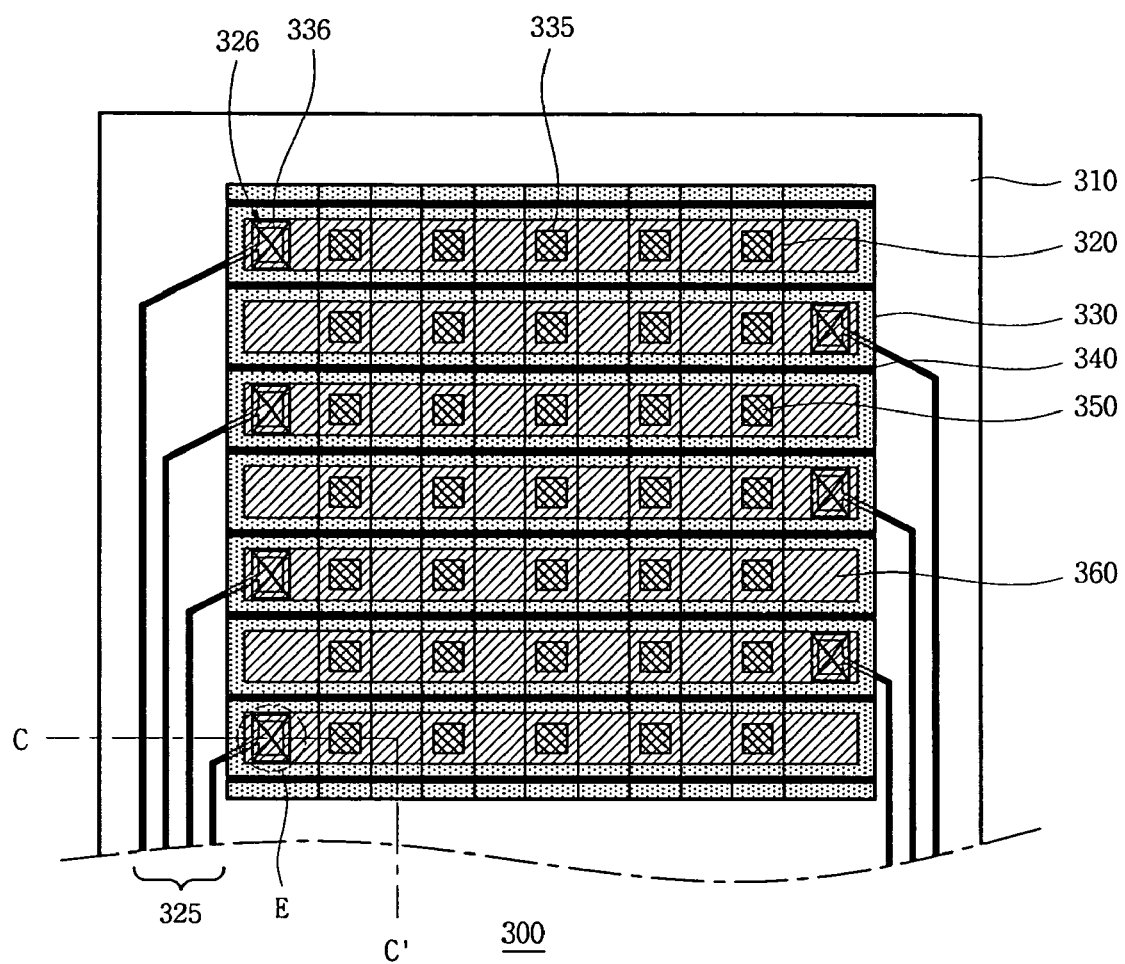
Figure 3H:
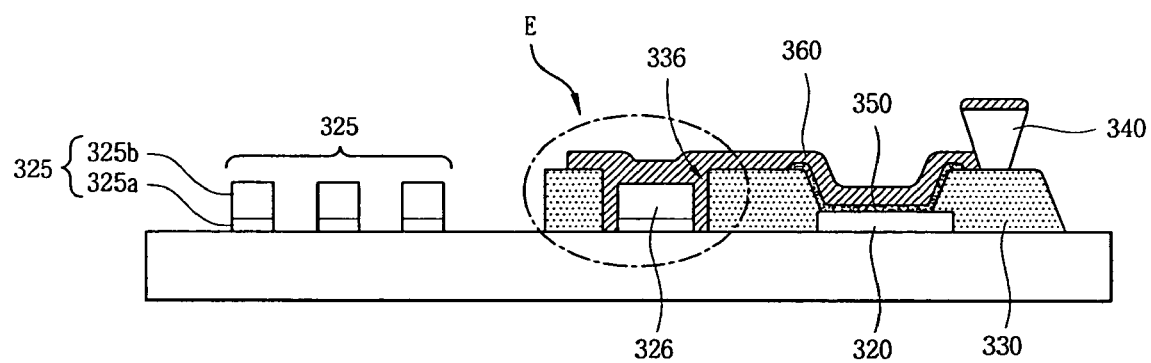

Referring to FIGS. 3E and 3F, a negative photo-resist is coated on the insulating layer 330 and then exposed to light and developed thereby to form barrier ribs 340. The barrier ribs 340 are crossing the first electrodes 320 and can be formed to be spaced from each other. And then, emission layers 350 are formed on the first electrodes 320 exposed by the openings 335. Here, the emission layers 350 create excitons by recombining electrons and holes to emit lights. The emission layers 350 may comprise organic materials.

Returning now to FIGS. 3G and 3H, the second electrodes 360 are formed on the emission layers 350, upper and side surfaces of the contact parts 326 exposed by the contact holes 336. The second electrodes 360 may be cathodes to supply electrons to the emission layers 350, and may be patterned by the barrier ribs 340.

Here, the contact part 326 has broader contacting area with the second electrode 360 than in the conventional light emitting device because its upper and side surfaces are both exposed by the contact hole 336, and never leaves insulating layer on the contact part 326. As a result, the light emitting device according to the present invention can reduce the contact resistance between the second electrodes and contact parts and thus reduce its driving voltage. Also, the light emitting device according to the present invention can prevent a peeling phenomenon which has occurred conventionally.

Other Embodiments

Figure 4:
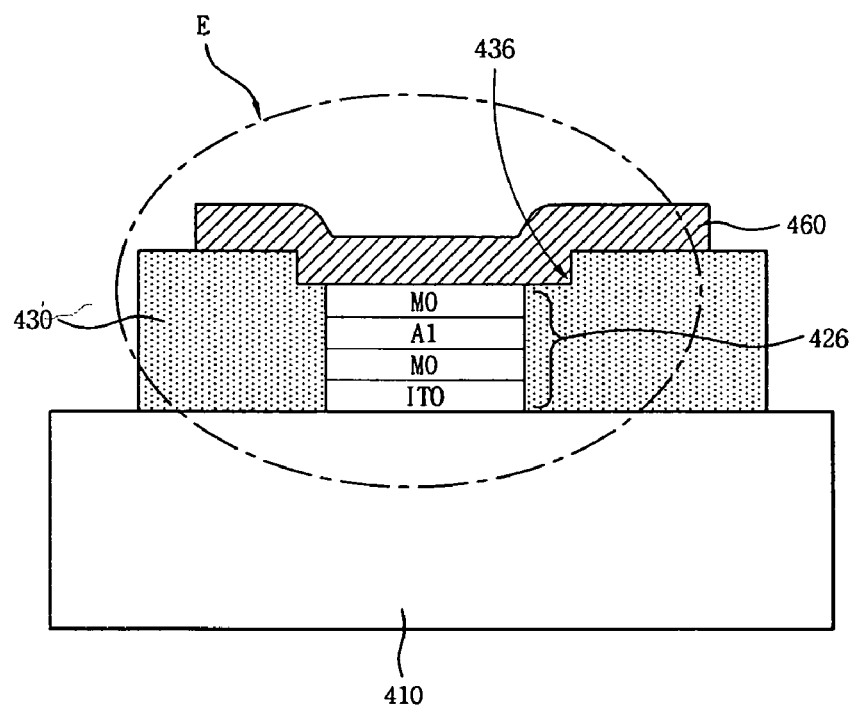
FIGS. 4 to 6 are cross sectional views of a contact region according to other embodiments of the present invention.
Figure 5:
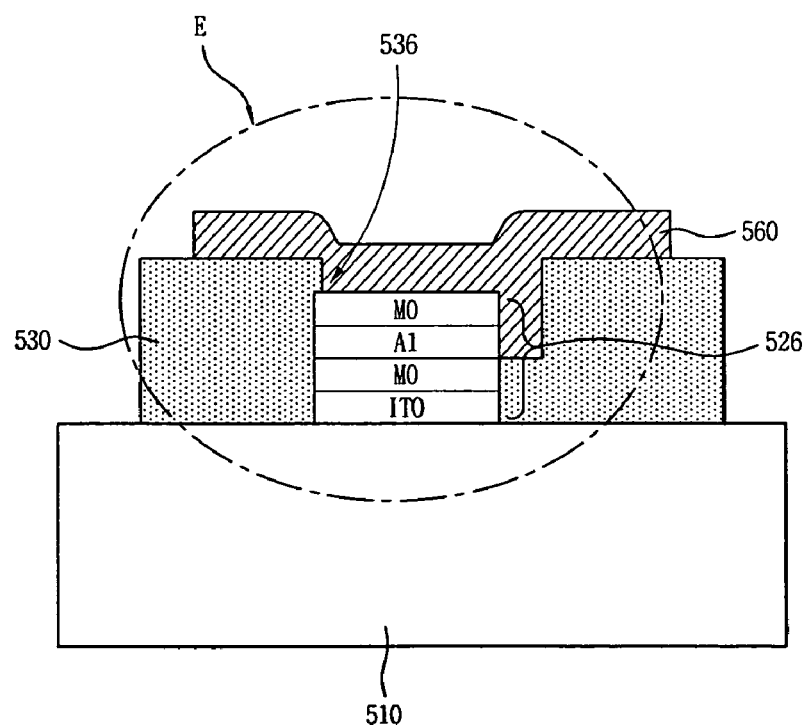
Figure 6:
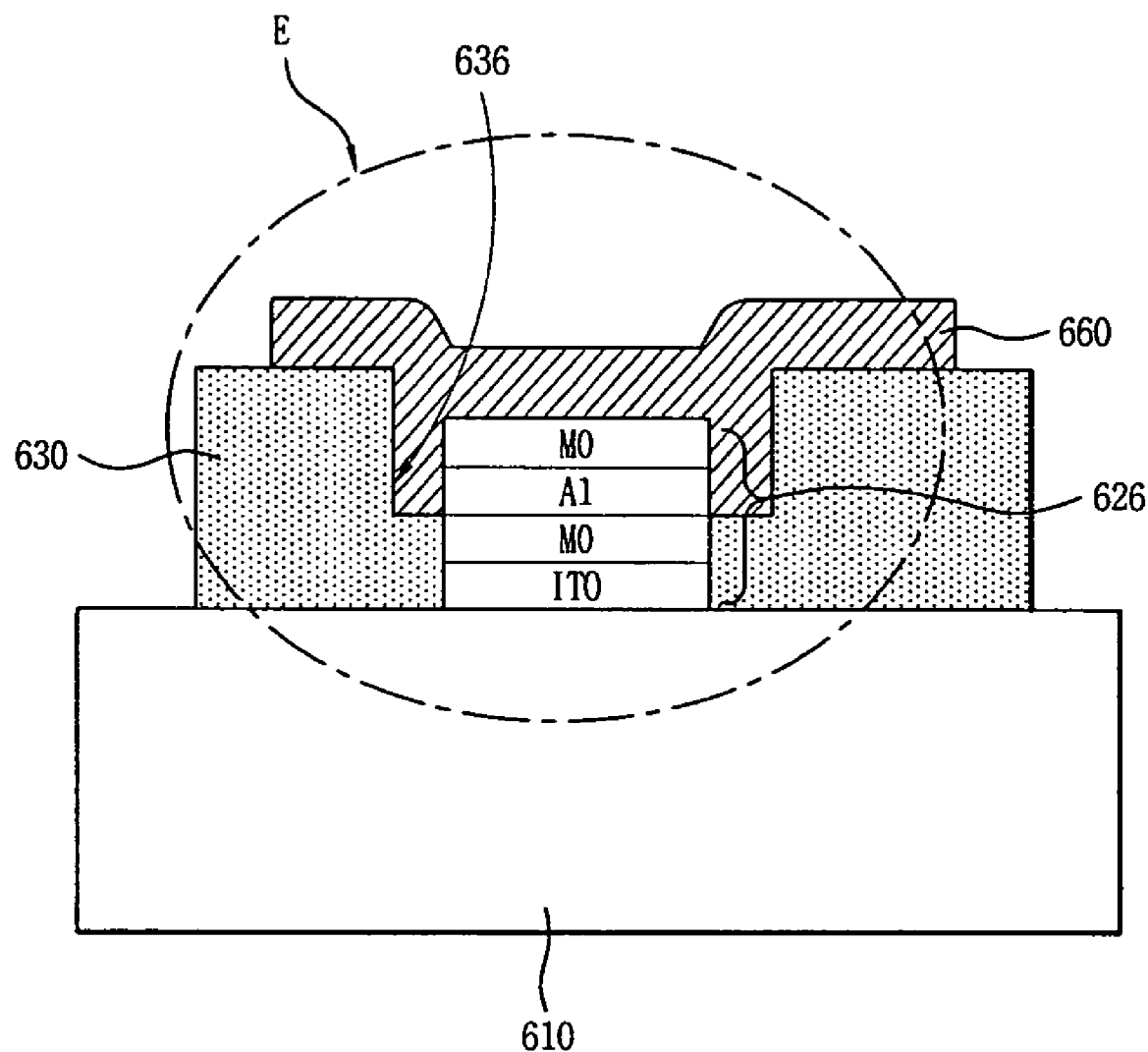

FIGS. 4 to 6 are cross sectional views of illustrating contact regions (E) of light emitting devices according to other embodiments of the present invention.

As shown in the contact region 'E' of FIG. 4, a contact part 426 formed as a multiple-layer structure of ITO/Mo/Al/Mo is disposed on a substrate 410. On the contact part 426 there is disposed an insulating layer 430 comprising a contact hole 436 for exposing the entire upper surface of the contact part 426. And, a second electrode 460 is disposed, which contacts with the entire upper surface of the contact part 426 through the contact hole 436. In case of the light emitting device comprising the contacting region as shown in FIG. 4, the interfacial resistance between the second electrode 460 and contact part 426 is reduced because the contacting area therebetween is broad, and therefore the driving voltage of the light emitting device is lowered.

As shown in the contact region 'E' of FIG. 5, a contact part 526 formed as a multiple-layer structure of ITO/Mo/Al/Mo is disposed on a substrate 510. On the contact part 526 there is disposed an insulating layer 530 comprising a contact hole 536 for exposing a portion of the upper and side surfaces of the contact part 526. And, a second electrode 560 is disposed, which contacts with the entire upper surface and a portion of the side surfaces of the contact part 526 through the contact hole 536. In case of the light emitting device comprising the contacting region as shown in FIG. 5, the interfacial resistance between the second electrode 560 and contact part 526 is reduced because the contacting area therebetween is broad, and therefore the driving voltage of a light emitting device is lowered.

The second electrode 560 is typically formed of Al. Therefore, in the case that the contact hole 536 is formed to expose the Al layer of the contact part 526 as shown in FIG. 5, the adherence strength between the second electrode 560 and contact part 526 can be enhanced and the interfacial resistance between the second electrode 560 and contact part 526 can be effectively reduced because the contact part 526 has the same material as the second electrode 560.

As shown in the contact region 'E' of FIG. 6, a contact part 626 formed as a multiple-layer structure of ITO/Mo/Al/Mo is disposed on a substrate 610. On the contact part 626 there is disposed an insulating layer 630 comprising a contact hole 636 for exposing a portion of the upper and side surfaces of the contact part 626. And, a second electrode 660 is disposed, which contacts with a portion of the upper and side surfaces of the contact part 626 through the contact hole 636. In case of the light emitting device comprising the contacting region as shown in FIG. 6, the interfacial resistance between the second electrode 460 and contact part 426 is reduced because the contacting area therebetween is broad, and therefore the driving voltage of the light emitting device can be lowered.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

I claim:

1. An organic light emitting device comprising:
   a first electrode and a wire comprising a contact part formed on a substrate;
   an insulating layer formed on the first electrode and a portion of the wire, the insulating layer comprising an opening which exposes a portion of the first electrode and a contact hole which exposes an entire upper surface and a portion of a side surface of the contact part so that no portion of the insulating layer is in contact with the entire upper surface and said portion of the side surface of the contact part;
   an emission layer comprising an organic material formed in the opening; and
   a second electrode formed on the emission layer and the entire upper surface of the contact part and said portion of the side surface of the contact part through the contact hole, wherein the content hole comprises:
   a first portion which is in contact with said portion of the side surface of the contact part, and a second portion which is in contact with the second electrode, wherein a width of the second portion is greater than a width of the first portion.

2. The light emitting device of claim 1, wherein the contact part and the wire comprise multiple layers comprising a conductive layer and a metal layer and wherein the metal layer comprises a material forming the second electrode.

3. The light emitting device of claim 2, wherein the contact part and the wire comprise multiple layers comprising a conductive layer, a first Molybdenum layer, an Aluminum layer and a second Molybdenum layer, each layer respectively formed on another layer in sequence, wherein the second portion of the contact hole exposes the side surface of the Al layer of the contact part and wherein the second electrode is made of Aluminum.

4. A method of fabricating a light emitting device comprising:
   forming a first electrode and a wire comprising a contact part on a substrate;
   forming an insulating layer on the first electrode and a portion of the wire, the insulating layer comprising an opening which exposes a portion of the first electrode and a contact hole which exposes an entire upper surface and a portion of a side surface of the contact part, so that no portion of the insulating layer is in contact with the entire upper surface and said portion of the side surface of the contact part;
   forming an emission layer comprising an organic material in the opening;
   forming a second electrode on the emission layer and the entire upper surface of the contact part and said portion of the side surface of the contact part through the contact hole, wherein the content hole comprises:
   a first portion which is in contact with said portion of the side surface of the contact part, and a second portion which is in contact with the second electrode, wherein a width of the second portion is greater than a width of the first portion.

5. The method of claim 4, further comprising:
   forming a barrier rib on the insulating layer, wherein the second electrode is formed separately by the barrier rib.

6. The method of claim 4, wherein the contact part and the wire comprise multiple layers comprising a conductive layer and a metal layer and wherein the metal layer comprises a material forming the second electrode.

7. The method of claim 6, wherein the contact part and the wire comprise multiple layers comprising a conductive layer, a first Molybdenum layer, an Al layer and a second Molybdenum layer, each layer respectively formed on another layer in sequence, wherein the second portion of the contact hole exposes the side surface of the Al layer of the contact part and wherein the second electrode is made of Aluminum.

* * * * *